(12) United States Patent
Fujii et al.

(10) Patent No.: US 9,852,925 B2
(45) Date of Patent: Dec. 26, 2017

(54) METHOD OF MANUFACTURING SEMICONDUCTOR DEVICE

(71) Applicant: Toyoda Gosei Co., Ltd., Kiyosu-shi (JP)

(72) Inventors: Takahiro Fujii, Kiyosu (JP); Masayoshi Kosaki, Kiyosu (JP); Takaki Niwa, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/457,881

(22) Filed: Mar. 13, 2017

(65) Prior Publication Data
US 2017/0278719 A1   Sep. 28, 2017

(30) Foreign Application Priority Data

Mar. 28, 2016 (JP) ................. 2016-063771

(51) Int. Cl.
*H01L 21/265* (2006.01)
*H01L 21/324* (2006.01)
*H01L 29/20* (2006.01)
*H01L 29/78* (2006.01)
*H01L 29/872* (2006.01)

(52) U.S. Cl.
CPC .... *H01L 21/3245* (2013.01); *H01L 21/26546* (2013.01); *H01L 29/2003* (2013.01); *H01L 29/7813* (2013.01); *H01L 29/872* (2013.01)

(58) Field of Classification Search
None
See application file for complete search history.

(56) References Cited

U.S. PATENT DOCUMENTS

| 2014/0054680 A1* | 2/2014 | Hashimoto | H01L 21/3242 257/329 |
| 2015/0380238 A1* | 12/2015 | Takashima | C23C 16/56 257/76 |
| 2017/0077830 A1* | 3/2017 | Fujii | H01L 21/3245 |

FOREIGN PATENT DOCUMENTS

JP   2007-184327 A   7/2007

* cited by examiner

*Primary Examiner* — Angel Roman
(74) *Attorney, Agent, or Firm* — McGinn IP Law Group, PLLC

(57) ABSTRACT

A technique of reducing the manufacturing cost of a semiconductor device is provided, There is provided a method of manufacturing a semiconductor device comprising an ion implantation process of implanting at least one of magnesium and beryllium by ion implantation into a first semiconductor layer that is mainly formed from a group III nitride; and a heating process of heating the first semiconductor layer in an atmosphere that includes an anneal gas of at least one of magnesium and beryllium, after the ion implantation process.

10 Claims, 14 Drawing Sheets

METHOD OF MANUFACTURING SEMICONDUCTOR DEVICE

CROSS-REFERENCE TO RELATED APPLICATION

The present application claims priority from Japanese patent applications No. 2016-063771 filed on Mar. 28, 2016, the content of which is hereby incorporated by reference into this application.

BACKGROUND

Field

The disclosure relates to a method of manufacturing a semiconductor device.

Related Art

A semiconductor device using a group III nitride such as gallium nitride (GaN) as the semiconductor material has been known conventionally. The semiconductor device may include p-type semiconductor regions. JP 2007-184327A describes a method of performing ion implantation multiple times in order to form p-type semiconductor regions.

The ion implantation process is an expensive process. There is accordingly a need for decreasing the frequency of ion implantation, in order to reduce the manufacturing cost of the semiconductor device.

SUMMARY

In order to solve at least part of the problems described above, the disclosure may be implemented by aspects described below.

(1) According to one aspect of the invention, there is provided a method of manufacturing a semiconductor device. The method of manufacturing the semiconductor device comprises: an ion implantation process of implanting at least one of magnesium and beryllium by ion implantation into a first semiconductor layer that is mainly formed from a group III nitride; and a heating process of heating the first semiconductor layer in an atmosphere that includes an anneal gas of at least one of magnesium and beryllium, after the ion implantation process. The method of manufacturing the semiconductor device of this aspect causes at least one of magnesium and beryllium to be taken into the first semiconductor layer in the heating process as well as in the ion implantation process. This accordingly decreases the frequency of ion implantation and results in reducing the manufacturing cost.

(2) According to one embodiment of the method of manufacturing the semiconductor device, when magnesium is included as an element implanted in the ion implantation process, magnesium may be included in the anneal gas, and when beryllium is included as an element implanted in the ion implantation process, beryllium may be included in the anneal gas. The method of manufacturing the semiconductor device of this aspect causes at least one of magnesium and beryllium to be taken into the first semiconductor layer in the heating process as well as in the ion implantation process. This accordingly decreases the frequency of ion implantation and results in reducing the manufacturing cost.

(3) According to one embodiment of the method of manufacturing the semiconductor device, when magnesium is included in the anneal gas, the anneal gas may further include hydrogen and ammonia. The method of manufacturing the semiconductor device of this aspect causes magnesium to be efficiently taken into the first semiconductor layer in the heating process. This further reduces the manufacturing cost.

(4) According to one embodiment of the method of manufacturing the semiconductor device, an implantation temperature in the ion implantation process may be not lower than 20° C. and not higher than 500° C. The method of manufacturing the semiconductor device of this aspect causes at least one of magnesium and beryllium to be taken into the first semiconductor layer in the heating process as well as in the ion implantation process. This accordingly decreases the frequency of ion implantation and results in reducing the manufacturing cost.

(5) According to one embodiment, the method of manufacturing the semiconductor device may further comprise a process of forming a protection film on a surface of the first semiconductor layer, prior to the ion implantation process; and a process of removing the protection film, after the heating process. The method of manufacturing the semiconductor device of this aspect suppresses the surface of the first semiconductor layer on which the protection film is formed from being roughened in the heating process.

(6) According to one embodiment of the method of manufacturing the semiconductor device, the protection film may include at least one amorphous material selected from the group consisting of aluminum nitride, gallium nitride, indium nitride, aluminum gallium nitride, gallium indium nitride, aluminum indium nitride and aluminum gallium indium nitride. The method of manufacturing the semiconductor device of this aspect causes at least one of magnesium and beryllium to be taken into the first semiconductor layer in the heating process as well as in the ion implantation process. This accordingly decreases the frequency of ion implantation and results in reducing the manufacturing cost.

(7) According to one embodiment of the method of manufacturing the semiconductor device, a heating temperature in the heating process may be not lower than 800° C. and not higher than 1200° C. The method of manufacturing the semiconductor device of this aspect causes at least one of magnesium and beryllium to be taken into the first semiconductor layer in the heating process as well as in the ion implantation process. This accordingly decreases the frequency of ion implantation and results in reducing the manufacturing cost.

(8) According to one embodiment of the method of manufacturing the semiconductor device, a pressure in the heating process may be not less than 10 kPa and not greater than 100 kPa. The method of manufacturing the semiconductor device of this aspect causes at least one of magnesium and beryllium to be taken into the first semiconductor layer in the heating process as well as in the ion implantation process. This accordingly decreases the frequency of ion implantation and results in reducing the manufacturing cost.

(9) According to one embodiment of the method of manufacturing the semiconductor device, a heating time in the heating process may be not shorter than 1 minute and not longer than 60 minutes. The method of manufacturing the semiconductor device of this aspect causes at least one of magnesium and beryllium to be taken into the first semiconductor layer in the heating process as well as in the ion implantation process. This accordingly decreases the frequency of ion implantation and results in reducing the manufacturing cost.

(10) According to one embodiment, the method of manufacturing the semiconductor device may further comprise a process of forming a second semiconductor layer mainly from a group III nitride on a surface of the first semiconductor layer, after the heating process. The method of manufacturing the semiconductor device of this aspect causes at least one of magnesium and beryllium to be taken into the first semiconductor layer in the heating process as well as in the ion implantation process. This accordingly decreases the frequency of ion implantation and results in reducing the manufacturing cost.

The disclosure may be implemented by any of various aspects other than the method of manufacturing the semiconductor device described above, for example, a semiconductor device manufactured by the manufacturing method described above or an apparatus of manufacturing a semiconductor device according to the manufacturing method described above.

The method of manufacturing the semiconductor device according to any one of the aspects described above causes at least one of magnesium and beryllium to be taken into the first semiconductor layer in the heating process as well as in the ion implantation process. This accordingly decreases the frequency of ion implantation and results in reducing the manufacturing cost.

DESCRIPTION OF EMBODIMENTS

A. First Embodiment

A-1. Structure of Semiconductor Device

Figure 1:
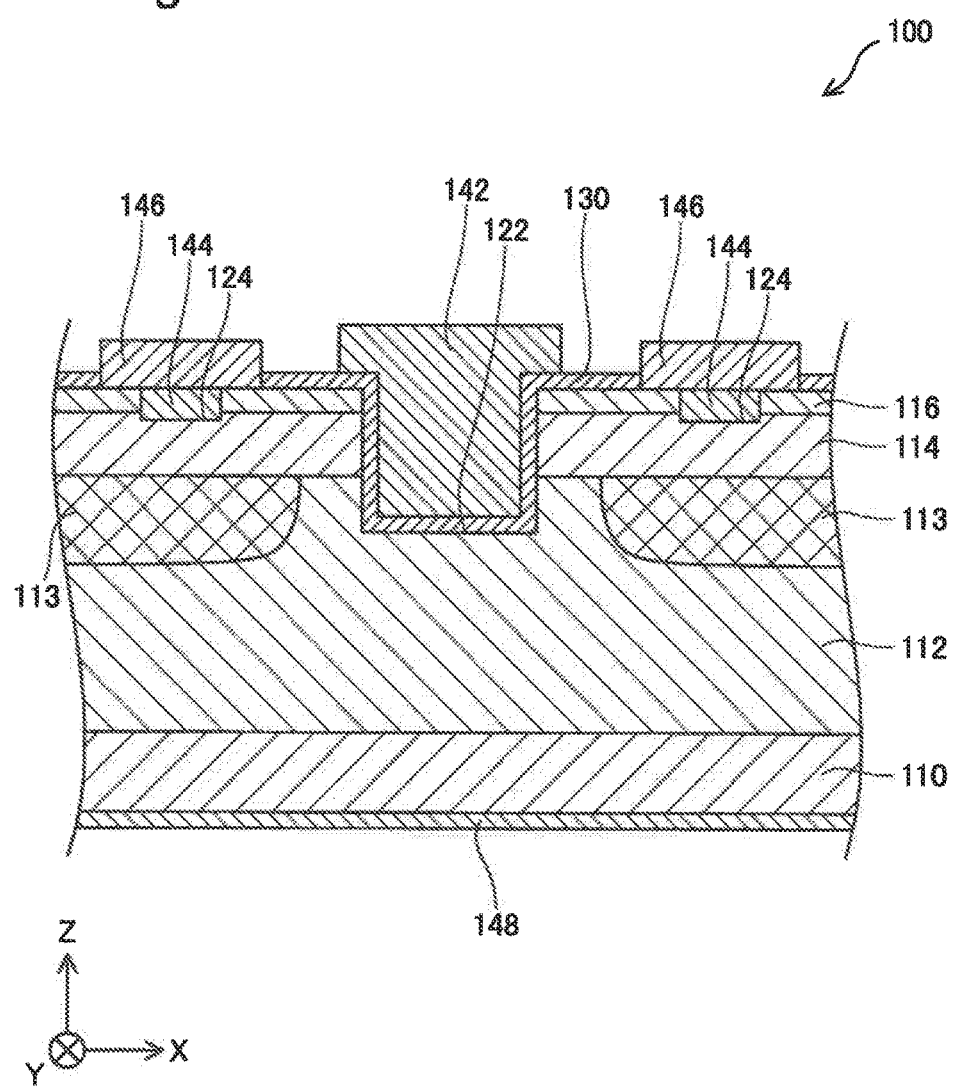
FIG. 1 is a sectional view schematically illustrating the structure of a semiconductor device according to a first embodiment.

FIG. 1 is a sectional view schematically illustrating the structure of a semiconductor device 100 according to a first embodiment. XYZ axes orthogonal to one another are illustrated in FIG. 1. Among the XYZ axes of FIG. 1, the X axis denotes a left-right axis on the sheet surface of FIG. 1. +X-axis direction denotes a rightward direction on the sheet surface, and −X-axis direction denotes a leftward direction on the sheet surface. Among the XYZ axes of FIG. 1, the Y axis denotes a front-back axis on the sheet surface of FIG. 1. +Y-axis direction denotes a backward direction on the sheet surface, and −Y-axis direction denotes a forward direction on the sheet surface. Among the XYZ axes of FIG. 1, the Z axis denotes a top-bottom axis on the sheet surface of FIG. 1. +Z-axis direction denotes an upward direction on the sheet surface, and −Z-axis direction denotes a downward direction on the sheet surface. The XYZ axes illustrated in other drawings correspond to the XYZ axes of FIG. 1.

According to this embodiment, the semiconductor device 100 is a GaN-based semiconductor device formed by using gallium nitride (GaN). According to this embodiment, the semiconductor device 100 is a vertical trench MOSFET (metal-oxide-semiconductor field-effect transistor). According to this embodiment, the semiconductor device 100 is used for power control and is also called power device.

The semiconductor device 100 includes a substrate 110, an n-type semiconductor layer 112, p-type semiconductor regions 113, a p-type semiconductor layer 114 and an n-type semiconductor layer 116. The semiconductor device 100 has a trench 122 and recesses 124 as structures formed in these semiconductor layers. The semiconductor device 100 further includes an insulation film 130, a gate electrode 142, body electrodes 144, source electrodes 146 and a drain electrode 148.

The substrate 110 of the semiconductor device 100 is a plate-like semiconductor extended along the X axis and the Y axis. According to this embodiment, the substrate 110 is mainly made of gallium nitride (GaN). In the description hereof, the expression of "mainly made of A (for example, gallium nitride) (GaN))" means containing A (for example, gallium nitride (GaN)) at 90% or higher molar fraction. According to this embodiment, the substrate 110 is an n-type semiconductor containing silicon (Si) as a donor element. According to this embodiment, the average concentration of silicon (Si) contained in the substrate 110 is not lower than $1 \times 10^{18}$ cm$^{-3}$. The thickness (length in the Z-axis direction) of the substrate 110 is not less than 100 μm (micrometer) and may be, for example, 300 μm according to this embodiment.

The n-type semiconductor layer 112 of the semiconductor device 100 is a semiconductor having n-type characteristics. The n-type semiconductor layer 112 is also called first semiconductor layer. According to this embodiment, the n-type semiconductor layer 112 is located on a +Z-axis direction side of the substrate 110 and is extended along the X axis and the Y axis. The n-type semiconductor layer 112 is mainly made of a group III nitride. According to this embodiment, the n-type semiconductor layer 112 is mainly made of gallium nitride (GaN). According to this embodiment, the n-type semiconductor layer 112 contains silicon (Si) as a donor element (n-type impurity). According to this embodiment, the average concentration of silicon (Si) contained in the n-type semiconductor layer 112 is not higher than about $1 \times 10^{17}$ cm$^{-3}$ and may be, for example, $1 \times 10^{16}$ cm$^{-3}$. The thickness (length in the Z-axis direction) of the n-type semiconductor layer 112 is preferably not less than 5 μm and not greater than 20 μm and is more preferably not greater than 15 μm. According to this embodiment, the thickness (length in the Z-axis direction) of the n-type semiconductor layer 112 may be, for example, 10 μm.

The p-type semiconductor regions 113 of the semiconductor device 100 are areas formed by ion implantation into part of the n-type semiconductor layer 112. The semiconductor of the p-type semiconductor regions 113 has p-type characteristics. According to this embodiment, the p-type semiconductor regions 113 are formed at positions away from the trench 122 and are arranged adjacent to the n-type semiconductor layer 112 and the p-type semiconductor layer 114. According to this embodiment, the p-type semiconductor regions 113 are mainly made of gallium nitride (GaN), like the n-type semiconductor layer 112. According to this embodiment, the p-type semiconductor regions 113 contain magnesium (Mg) as an acceptor element (p-type impurity). In the p-type semiconductor regions 113, the concentration of the p-type impurity is higher than the concentration of the n-type impurity. According to this embodiment, in the p-type semiconductor regions 113, the concentration of the p-type impurity is at least 100 times higher than the concentration of the n-type impurity. According to this embodiment, the average concentration of magnesium (Mg) contained in the p-type semiconductor regions 113 is not lower than $1\times10^{18}$ cm$^{-3}$.

The p-type semiconductor layer 114 of the semiconductor device 100 is a semiconductor having p-type characteristics. The p-type semiconductor layer 114 is also called second semiconductor layer. The p-type semiconductor layer 114 is mainly made of a group III nitride. According to this embodiment, the p-type semiconductor layer 114 is located on a +Z-axis direction side of the n-type semiconductor layer 112 and the p-type semiconductor regions 113 and is extended along the X axis and the Y axis. According to this embodiment, the p-type semiconductor layer 114 is mainly made of gallium nitride (GaN). According to this embodiment, the p-type semiconductor layer 114 contains magnesium (Mg) as an acceptor element. According to this embodiment, the average concentration of magnesium (Mg) contained in the p-type semiconductor layer 114 is not higher than about $4\times10^{18}$ cm$^{-3}$. According to this embodiment, the thickness (length in the Z-axis direction) of the p-type semiconductor layer 114 may be, for example, about 1.0 μm.

The n-type semiconductor layer 116 of the semiconductor device 100 is a semiconductor having n-type characteristics. According to this embodiment, the n-type semiconductor layer 116 is located on a +Z-axis direction side of the p-type semiconductor layer 114 and is extended along the X axis and the Y axis. According to this embodiment, the n-type semiconductor layer 116 is mainly made of gallium nitride (GaN). According to this embodiment, the n-type semiconductor layer 116 contains silicon (Si) as a donor element. According to this embodiment, the average concentration of silicon (Si) contained in the n-type semiconductor layer 116 is not lower than $1\times10^{18}$ cm$^{-3}$ and may be, for example, about $3\times10^{18}$ cm$^{-3}$. According to this embodiment, the thickness (length in the Z-axis direction) of the n-type semiconductor layer 116 is not greater than 0.4 μm and may be, for example, about 0.2 μm.

The trench 122 of the semiconductor device 100 is a groove that is formed from a +Z-axis direction side face of the n-type semiconductor layer 116 to pass through the n-type semiconductor layer 116 and the p-type semiconductor layer 114 and is recessed into the n-type semiconductor layer 112. According to this embodiment, the trench 122 is a structure formed by dry etching of the n-type semiconductor layer 116, the p-type semiconductor layer 114 and the n-type semiconductor layer 112.

The recesses 124 of the semiconductor device 100 are concaves that are formed from the +Z-axis direction side face of the n-type semiconductor layer 116 to pass through the n-type semiconductor layer 116 and are recessed into the p-type semiconductor layer 114. According to this embodiment, the recesses 124 are structures formed by dry etching of the n-type semiconductor layer 116 and the p-type semiconductor layer 114.

The insulation film 130 of the semiconductor device 100 is a film that is formed inside of the trench 122 and has electrical insulation property. According to this embodiment, the insulation film 130 is formed from inside of the trench 122 over to part of the +Z-axis direction side face of the n-type semiconductor layer 116. According to this embodiment, the insulation film 130 is mainly made of silicon dioxide (SiO$_2$).

The gate electrode 142 of the semiconductor device 100 is an electrode formed inside of the trench 122 via the insulation film 130. According to this embodiment, the gate electrode 142 is formed from inside of the trench 122 over to part of a +Z-axis direction side face of the insulation film 130 that is outside of the trench 122. According to this embodiment, the gate electrode 142 is mainly made of aluminum (Al). When a voltage is applied to the gate electrode 142, an inversion layer is formed in the p-type semiconductor layer 114. This inversion layer serves as a channel, so that a conductive path is formed between the source electrode 146 and the drain electrode 148.

The body electrodes 144 of the semiconductor device 100 are electrodes that are formed in the recesses 124 and are arranged to be in ohmic contact with the p-type semiconductor layer 114. According to this embodiment, the body electrodes 144 are electrodes formed by heat treatment of a layer that is mainly made of palladium (Pd).

The source electrodes 146 of the semiconductor device 100 are electrodes that are arranged to be in ohmic contact with the n-type semiconductor layer 116. According to this embodiment, the source electrode 146 is formed on the body electrode 144 over to part of the +Z-axis direction side face of the n-type semiconductor layer 116. According to another embodiment, the source electrode 146 may be formed in a site away from the body electrode 144. According to this embodiment, the source electrodes 146 are electrodes formed by stacking a layer mainly made of aluminum (Al) on a layer mainly made of titanium (Ti) and processing the stacked layers by heat treatment.

The drain electrode 148 of the semiconductor device 100 is an electrode that is arranged to be in ohmic contact with a −Z-axis direction-side rear face of the substrate 110. According to this embodiment, the drain electrode 148 is an electrode formed by stacking a layer mainly made of aluminum (Al) on a layer mainly made of titanium (Ti) and processing the stacked layers by heat treatment.

A-2. Method of Manufacturing Semiconductor Device

Figure 2:
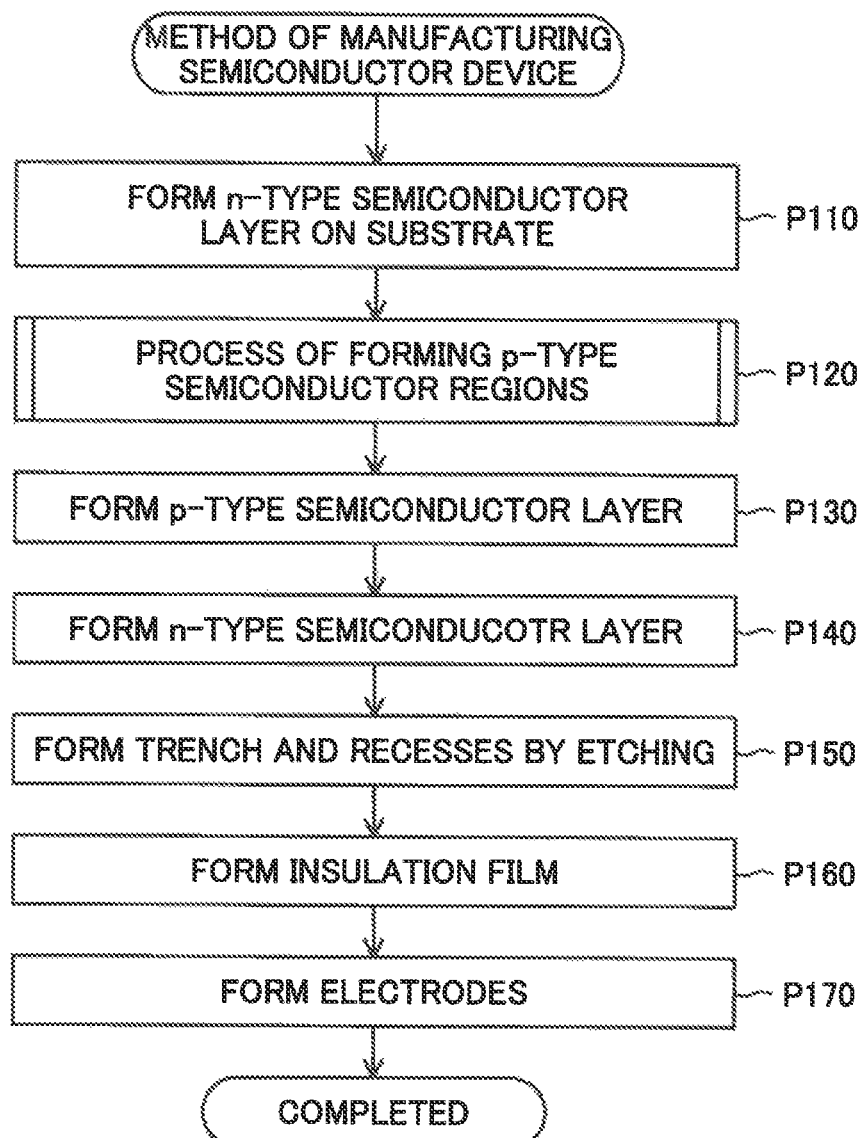
FIG. 2 is a process chart showing a method of manufacturing the semiconductor device according to the first embodiment.

FIG. 2 is a process chart showing a method of manufacturing the semiconductor device 100 according to the first embodiment. The manufacturer first forms the n-type semiconductor layer 112 on the substrate 110 by crystal growth (process P110). According to this embodiment, the manufacturer forms the n-type semiconductor layer 112 on a +Z-axis direction-side surface of the substrate 110. According to this embodiment, the manufacture forms the n-type semiconductor layer 112 by metal organic chemical vapor deposition (MOCVD). The n-type semiconductor layer 112 is mainly made of a group III nitride and is mainly made of gallium nitride (GaN) according to this embodiment.

After forming the n-type semiconductor layer 112 (process P110), the manufacturer forms the p-type semiconductor regions 113 in part of the n-type semiconductor layer 112 by ion implantation (process P120). According to this embodiment, the manufacturer forms the p-type semiconductor regions 113 in partial areas on the +Z-axis direction side of the n-type semiconductor layer 112.

Figure 3:
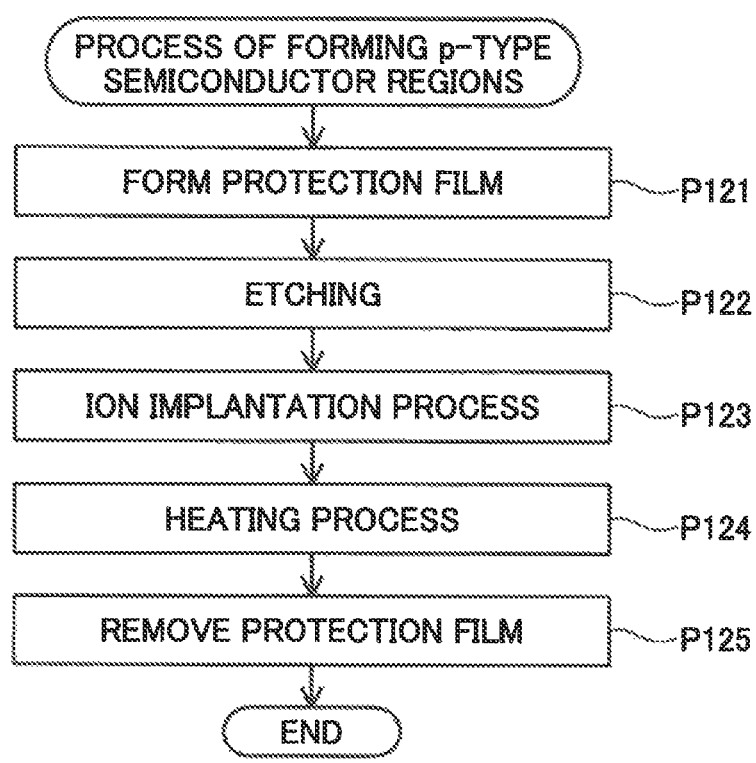
FIG. 3 is a process chart showing the details of a process of forming p-type semiconductor regions according to the first embodiment.

FIG. 3 is a process chart showing the details of the process of forming the p-type semiconductor regions 113 (process P120) according to the first embodiment. In the process of forming the p-type semiconductor regions 113 (process P120), the manufacturer first forms a protection film used for ion implantation on a +Z-axis direction-side surface of the n-type semiconductor layer 112 (process P121). Accordingly, the protection film is formed on the surface of the n-type semiconductor layer 112, prior to an ion implantation process described later.

Figure 4:
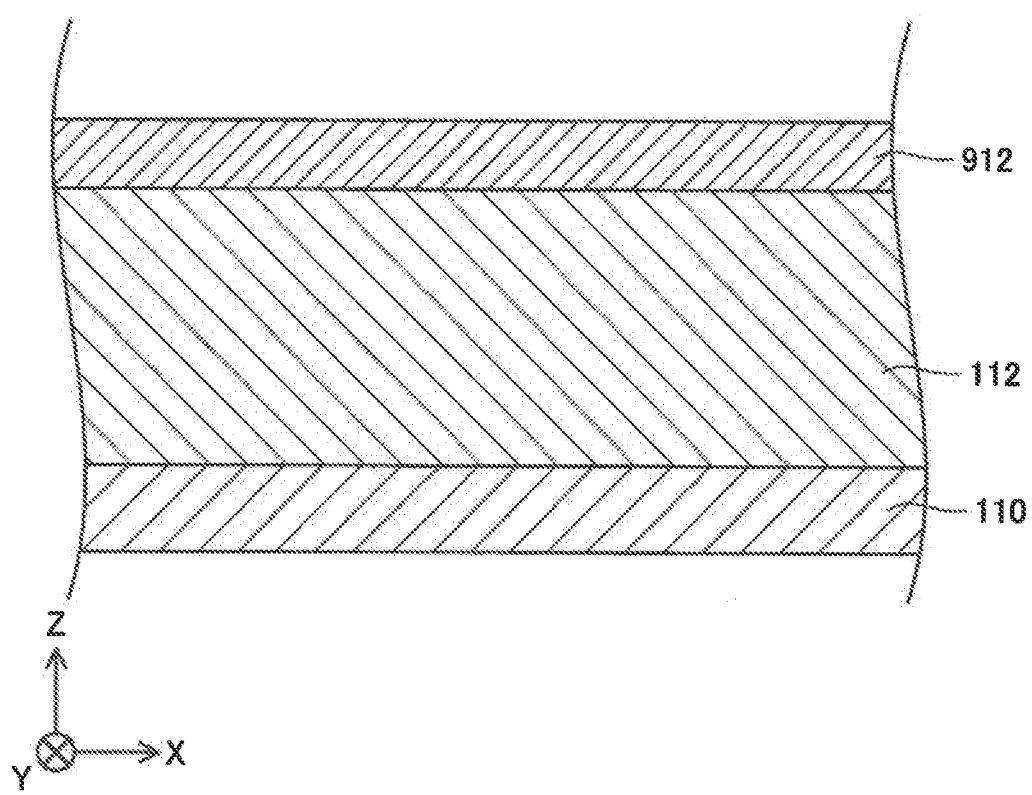
FIG. 4 is a sectional view schematically illustrating the state that a protection film is formed on an n-type semiconductor layer.

FIG. 4 is a sectional view schematically illustrating the state that a protection film 912 is formed on the n-type semiconductor layer 112. According to this embodiment, immediately after crystal growth of the n-type semiconductor layer 112, the protection film 912 is formed on the n-type semiconductor layer 112 by crystal growth. The successive formation of the n-type semiconductor layer 112 and the protection film 912 prevents potential contamination due to incorporation of impurities between the n-type semiconductor layer 112 and the protection film 912. According to this embodiment, the manufacturer forms the protection film 912 on a +Z-axis direction-side surface of the n-type semiconductor layer 112. According to this embodiment, the manufacturer forms the protection film 912 by metal organic chemical vapor deposition (MOCVD).

The manufacturer forms the protection film 912 by using an element that does not serve as the donor element of the group III nitride semiconductor, as the main material. This configuration suppresses implantation of the material of the protection film 912 into the n-type semiconductor layer 112 in the ion implantation process described later. The "element that does not serve as the donor element of the group III nitride semiconductor" may be, for example, silicon (Si), oxygen (O) or germanium (Ge).

It is preferable that the protection film 912 includes at least one amorphous material selected from the group consisting of aluminum nitride (AlN), indium. nitride (InN), aluminum gallium nitride (AlGaN), gallium indium nitride (GaInN), aluminum indium nitride (AlInN) and aluminum gallium indium nitride (AlGaInN). According to this embodiment, the protection film 912 is mainly made of amorphous aluminum nitride (AlN). The thickness of the protection film 912 is preferably not less than 100 nm and not greater than 1000 nm and may be, for example, 300 nm according to this embodiment. The growth temperature in crystal growth of the protection film 912 is preferably not lower than 300° C. and not higher than 1500° C., and the growth pressure is preferably not lower than 10 kPa and not higher than 100 kPa.

After forming the protection film 912 (process P121), the manufacturer etches out unrequired portions of the protection film 912 by lithography (process P122).

Figure 5:
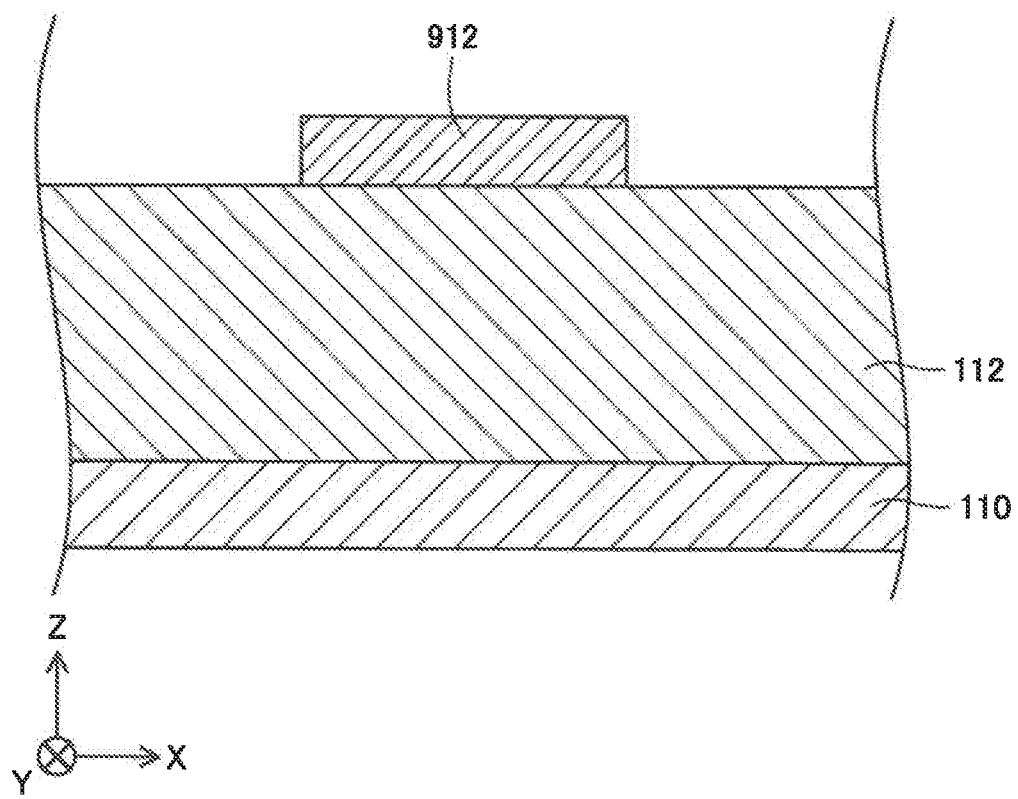
FIG. 5 is a sectional view schematically illustrating the state after etching out unrequired portions of the protection film.

FIG. 5 is a sectional view schematically illustrating the state after etching out the unrequired portions of the protection film 912. According to this embodiment, the manufacturer performs wet etching using tetramethylammonium hydroxide (TMAH) at 85° C. Dry etching may be employed in place of wet etching.

After etching out the unrequired portions of the protection film 912 (process P122), the manufacturer implants at least one of magnesium (Mg) and beryllium (Be) into the n-type semiconductor layer 112 by ion implantation (process P123). The process P123 is also called ion implantation process. According to this embodiment, the manufacturer implants the p-type impurity from the +Z-axis direction side into the n-type semiconductor layer 112. Accordingly, p-type implanted regions that are regions in which the p-type impurity is implanted are thus formed in the partial areas on the +Z-axis direction side of the n-type semiconductor layer 112.

Figure 6:
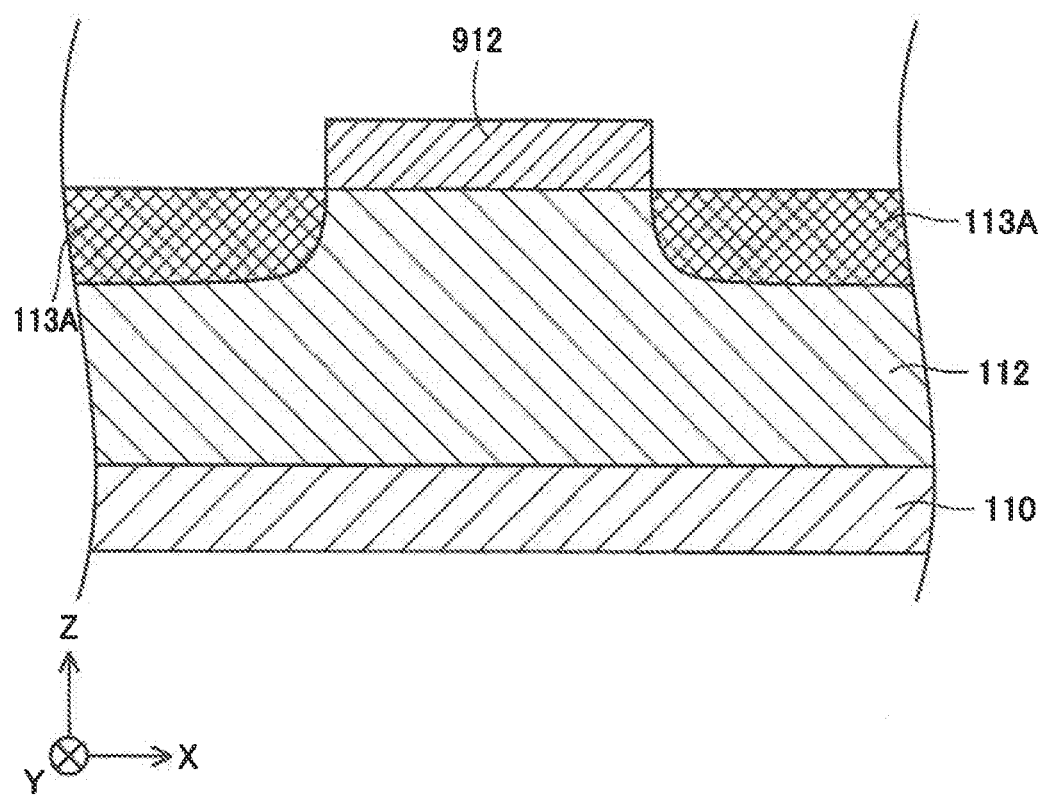
FIG. 6 is a sectional view schematically illustrating the state after formation of p-type implanted regions.

FIG. 6 is a sectional view schematically illustrating the state after formation of p-type implanted regions 113A in the partial areas on the +Z-axis direction side of the n-type semiconductor layer 112 that are not covered by the protection film 912. According to this embodiment, magnesium (Mg) is used as the p-type impurity. According to another embodiment, beryllium (Be) may be used instead of magnesium (Mg), or both magnesium (Mg) and beryllium (Be) may be used as the p-type impurity. The implantation temperature in the ion implantation process (process P123) is preferably not lower than 20° C. and not higher than 500° C. and may be, for example, 500° C. according to this embodiment. The implantation energy is controllable in the range of not lower than 1 keV and not higher than 500 keV and may be, for example, 230 keV according to this embodiment. The dose amount is preferably not lower than $10^{12}$ cm$^{-2}$ and not higher than $10^{16}$ cm$^{-2}$ and may be, for example, $1.7 \times 10^{15}$ cm$^2$ according to this embodiment. In terms of suppressing the effect of channeling, the implantation angle is preferably greater than 0 degree and less than 10 degrees with respect to the thickness direction (Z-axis direction) and may be, for example, 7 degrees with respect to the thickness direction (Z-axis direction).

After the ion implantation process (process P123), the manufacturer heats the n-type semiconductor layer 112 in an atmosphere that includes an anneal gas of at least one of magnesium (Mg) and beryllium (Be) (process P124). The process P124 is also called heating process. In the description hereof, the "anneal gas" denotes a gas which the n-type semiconductor layer 112 (first semiconductor layer) is exposed to in the heating process. According to this embodiment, the heating process (process P124) is performed in the state that at least part of the surface of the p-type implanted regions 113A is exposed. This process activates the p-type impurity that is implanted by ion implantation and enables a surface layer on the +Z-axis direction side of the n-type semiconductor layer 112 to be doped with magnesium (Mg). This embodiment uses an anneal gas including magnesium (Mg). More specifically, biscyclopentadienyl magnesium (Cp$_2$Mg) may be used as the anneal gas including magnesium (Mg).

The anneal gas is to be filled (charged) in the circumference of the n-type semiconductor layer 112 (atmosphere) in the heating process during manufacture of the semiconductor device 100. Especially in the case of manufacture of a group III nitride semiconductor device, the anneal gas generally includes hydrogen (H) and ammonia (NH$_3$). According to this embodiment, in order to dope the n-type semiconductor layer 112 with magnesium (Mg) more efficiently, the anneal gas includes hydrogen (H) and ammonia (NH$_3$). According to this embodiment, hydrazine (N$_2$H$_2$) is used as a hydrogen (H) source other than ammonia (NH$_3$).

Hydrogen (H) serves as a gas that carries ammonia ($NH_3$) and magnesium (Mg) (i.e., as the carrier gas). Ammonia ($NH_3$) is decomposed into nitrogen ion and hydrogen ion by the heat in the heating process. The nitrogen ion suppresses removal of nitrogen from the n-type semiconductor layer 112, while the hydrogen ion is combined with magnesium (Mg) in the n-type semiconductor layer 112 to accelerate activation of magnesium (Mg) in the n-type semiconductor layer 112.

It is generally known that magnesium (Mg) atom and hydrogen (H) atom are present in the bonding state in a semiconductor (GaN) layer. Inclusion of hydrogen (H) and ammonia ($NH_3$) in the anneal gas is thus expected to facilitate bonding of magnesium (Mg) atom with hydrogen (H) atom in the heating process (process P124). As a result, it is expected to dope the n-type semiconductor layer 112 with magnesium (Mg) more efficiently. The similar effects are expected when beryllium (Be) is used. The concentration of magnesium (Mg) to be diffused in the n-type semiconductor layer 112 may be regulated, for example, by controlling the molar ratio of biscyclopentadienyl magnesium ($Cp_2Mg$) to ammonia ($NH_3$) included in the anneal gas. More specifically, increasing the molar ratio ($Cp_2Mg/NH_3$) of biscyclopentadienyl magnesium ($Cp_2Mg$) to ammonia ($NH_3$) included in the anneal gas results in increasing the concentration of magnesium (Mg) to be diffused in the n-type semiconductor layer 112.

Figure 7:
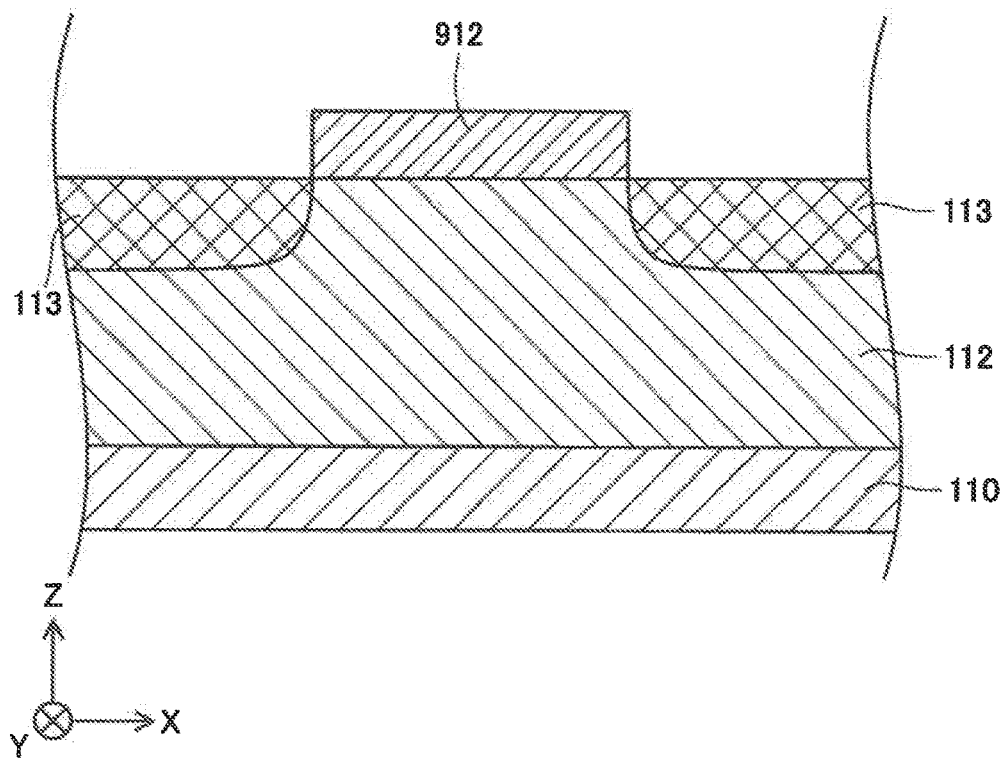
FIG. 7 is a sectional view schematically illustrating the state after a heating process.

FIG. 7 is a sectional view schematically illustrating the state after the heating process (process P124). This heating process (P124) activates the p-type impurity and changes the p-type implanted regions 113A to the p-type semiconductor regions 113. In terms of accelerating fixation of the p-type impurity in the n-type semiconductor layer 112 and suppressing damage on the surface of the n-type semiconductor layer 112, the respective conditions in the heating process are preferably in the following ranges. The heating temperature in the heating process (process P124) is preferably not lower than 800° C. and not higher than 1200° C. and may be, for example, 1050° C. according to this embodiment. The heating time in the heating process (process P124) is preferably not shorter than 1 minute and not longer than 60 minutes and may be, for example, 15 minutes according to this embodiment. The pressure in the heating process (process P124) is preferably not less than 10 kPa and not greater than 100 kPa and may be, for example, 100 kPa according to this embodiment.

After the heating process (process P124), the manufacturer removes the protection film 912 from above the n-type semiconductor layer 112 (process P125). According to this embodiment, the manufacturer removes the protection film 912 by wet etching using tetramethylammonium hydroxide (TMAH) at 85° C. Dry etching may be employed in place of wet etching.

Figure 8:
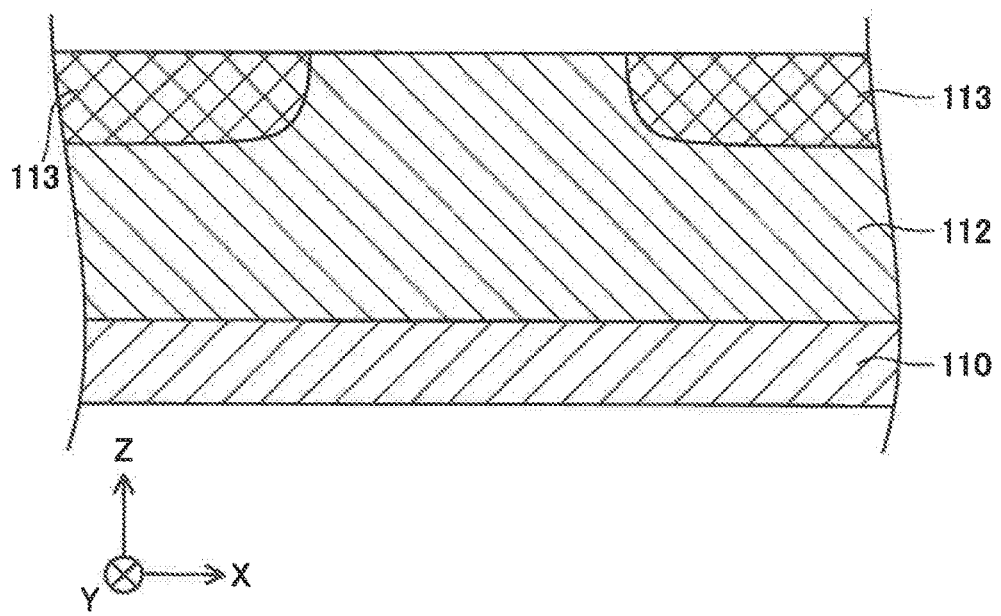
FIG. 8 is a sectional view schematically illustrating the state after removal of the protection film.

FIG. 8 is a sectional view schematically illustrating the state after removal of the protection film 912. Removing the protection film 912 (process P125 shown in FIG. 3) terminates the process of forming the p-type semiconductor regions 113 (process P120).

After forming the p-type semiconductor regions 113 (process P120 shown in FIG. 2), the manufacturer forms the p-type semiconductor layer 114 mainly from a group III nitride on the surface of the n-type semiconductor layer 112 and the p-type semiconductor regions 113 (process P130). According to this embodiment, the p-type semiconductor layer 114 is mainly formed from gallium nitride (GaN) by metal organic chemical vapor deposition (MOCVD).

After forming the p-type semiconductor layer 114 (process P130), the manufacturer forms the n-type semiconductor layer 116 on the p-type semiconductor layer 114 (process P140).

Figure 9:
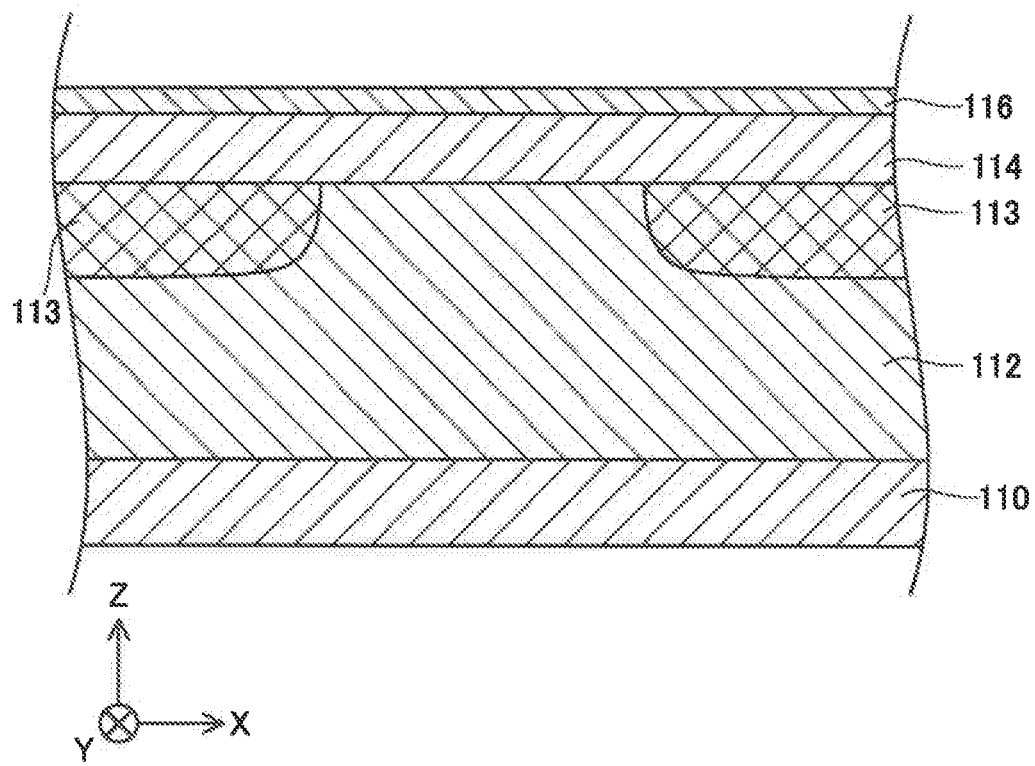
FIG. 9 is a sectional view schematically illustrating the state after formation of an n-type semiconductor layer.

FIG. 9 is a sectional view schematically illustrating the state after formation of the n-type semiconductor layer 116. According to this embodiment, the manufacturer forms the n-type semiconductor layer 116 by metal organic chemical vapor deposition (MOCVD).

After forming the n-type semiconductor layer 116 (process P140), the manufacturer forms a trench and recesses by etching (process P150).

Figure 10:
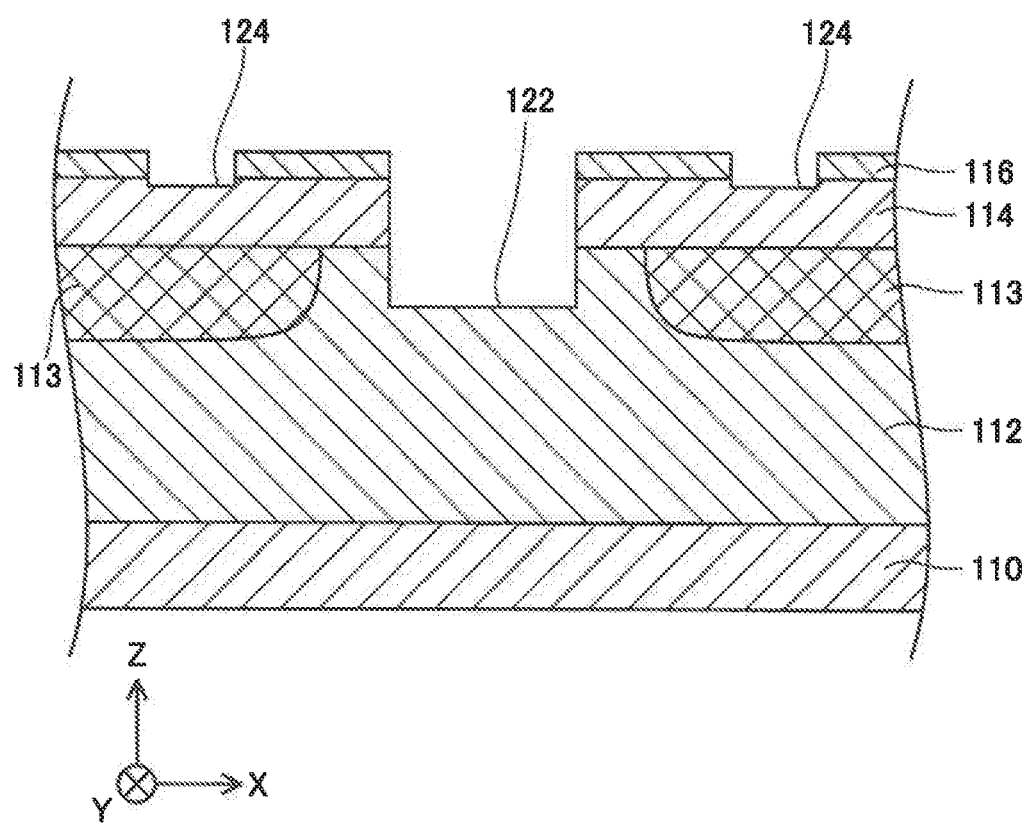
FIG. 10 is a sectional view schematically illustrating the state after formation of a trench and recesses.

FIG. 10 is a sectional view schematically illustrating the state after formation of the trench 122 and the recesses 124. According to this embodiment, the manufacturer forms the trench 122 and the recesses 124 by dry etching.

After forming the trench 122 and the recesses 124 (process P150), the manufacturer forms an insulation film (process P160).

Figure 11:
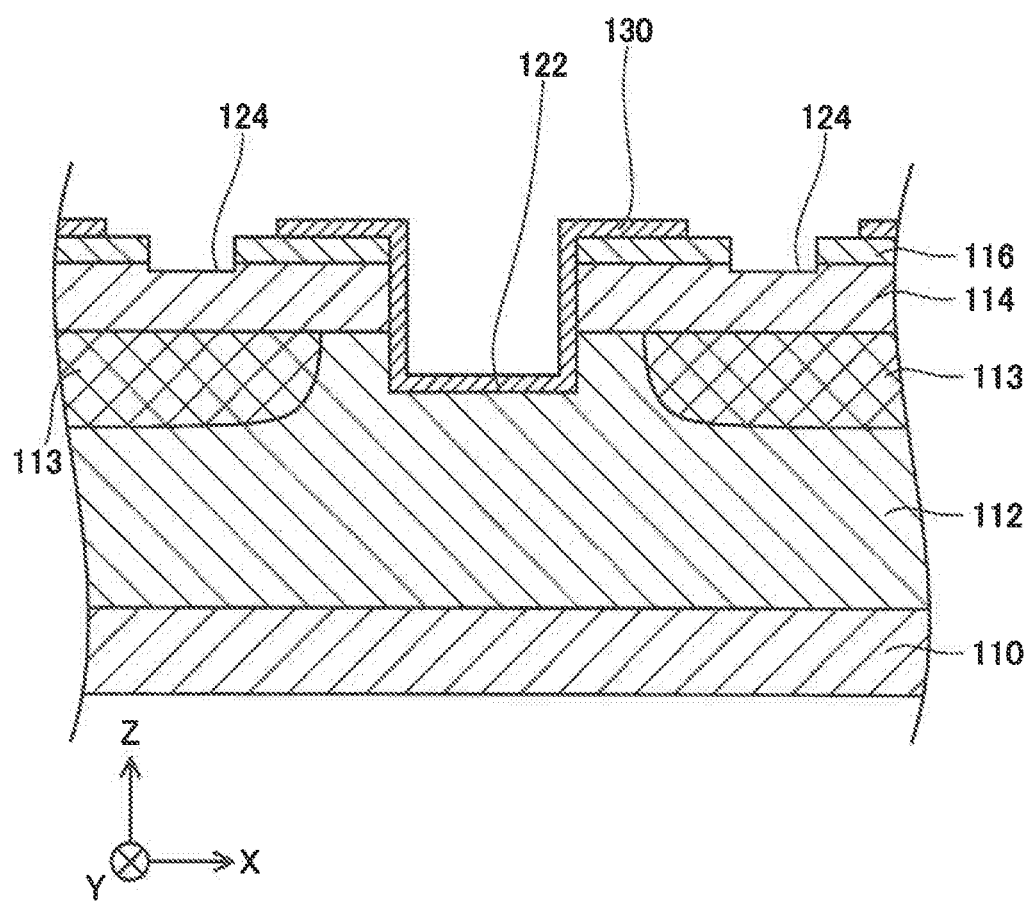
FIG. 11 is a sectional view schematically illustrating the state after formation of an insulation film.

FIG. 11 is a sectional view schematically illustrating the state after formation of the insulation film 130. According to this embodiment, the manufacturer forms the insulation film 130 by atomic layer deposition (ALD). The sputtering method may be employed, instead of atomic layer deposition.

After forming the insulation film 130 (process P160), the manufacturer forms the gate electrode 142, the body electrodes 144, the source electrodes 146 and the drain electrode 148 (process P170). The sputtering method is employed for formation of the electrodes according to this embodiment, but the vapor deposition method may be employed. The semiconductor device 100 is completed by the series of processes described above.

A-3. Advantageous Effects

The manufacturing method of the first embodiment described above includes the heating process (process P124) that heats the n-type semiconductor layer 112 in the atmosphere including the anneal gas of magnesium (Mg), after the ion implantation process (process P123). This configuration activates ion-implanted magnesium (Mg) and enables the surface layer on the +Z-axis direction side of the n-type semiconductor layer 112 to be doped with magnesium (Mg) in the heating process (process P124). This results in decreasing the frequency of ion implantation and reducing the manufacturing cost. The following describes the results of an evaluation test supporting that the surface layer on the +Z-axis direction side of the n-type semiconductor layer 112 is doped with magnesium (Mg) by the heating process (process P124).

A-4. Results of Test

Figure 12:
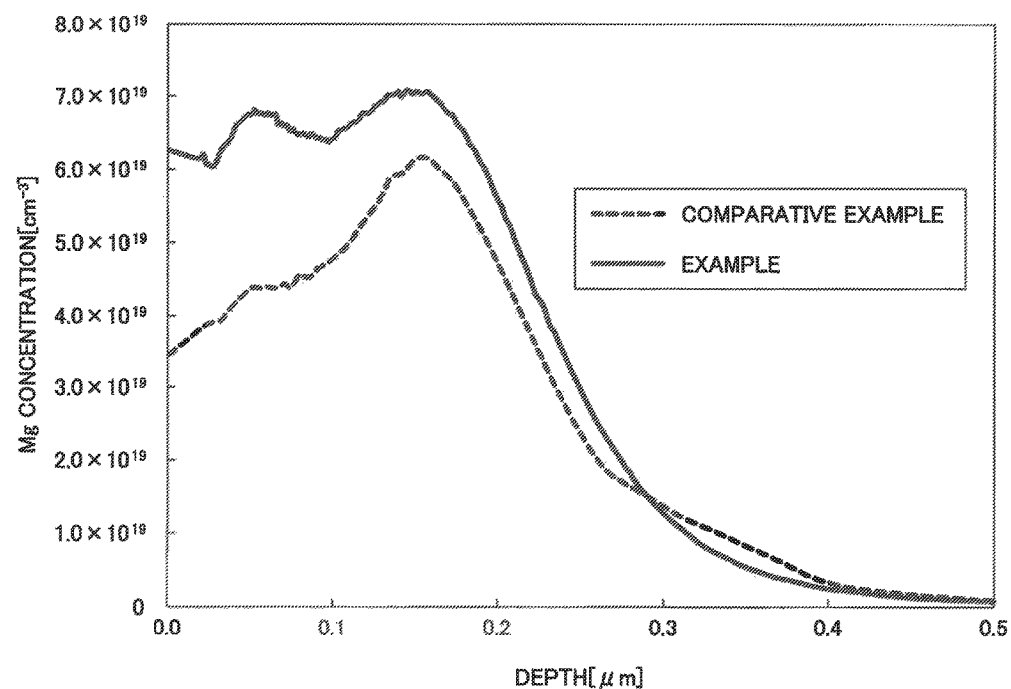
FIG. 12 is a graph showing the results of an evaluation test.

FIG. 12 is a graph showing the results of an evaluation test. The following samples were used for the evaluation test. More specifically, the examiner formed the n-type semiconductor layer 112 on the substrate 110 and subsequently performed ion implantation once under the following conditions:
  implantation temperature: 500° C.;
  implantation energy: 230 keV;
  dose amount: $1.7 \times 10^{15}$ $cm^{-2}$; and
  implantation angle: 7 degrees with respect to the thickness direction (Z-axis direction).

The examiner subsequently performed the heating process under the following conditions:
  heating time: 15 minutes;
  heating temperature: 1050° C.;
  pressure: 100 kPa
  ammonia ($NH_3$) flow rate: $3.7 \times 10^{-2}$ sccm;

hydrogen (H$_2$) flow rate: 3.7×10$^{-2}$ sccm; and
biscyclopentadienyl magnesium (Cp$_2$Mg) flow rate: 100 sccm.

FIG. 12 shows the measurement results of the impurity concentration in the n-type semiconductor layer 112 in the samples by secondary ion mass spectrometry (SIMS). The abscissa axis of FIG. 12 shows the depth (μm) in the −Z-axis direction of the n-type semiconductor layer 112, and the ordinate axis of FIG. 12 shows the magnesium (Mg) concentration (cm$^{-3}$). The depth of 0 μm indicates the +Z-axis direction-side surface of the n-type semiconductor layer 112. Example shows the result with the above heating process, and Comparative Example shows the result without the above heating process.

As shown in FIG. 12, the magnesium (Mg) concentration of Example is higher than the magnesium (Mg) concentration of Comparative Example with respect to substantially the entire area having the depth of 0 μm to 0.3 μm. More specifically, the magnesium (Mg) concentration of Example is about 1.5 times higher than the magnesium (Mg) concentration of Comparative Example with respect to the area having the depth of 0 μm to 0.15 μm. This result shows that especially the surface layer on the +Z-axis direction side of the n-type semiconductor layer 112 is doped with magnesium (Mg) by the heating process (process P124).

In general, magnesium (Mg) implanted by ion implantation replaces part of gallium (Ga) in the n-type semiconductor layer 112 and is activated in the heating process to serve as the acceptor. The crystal structure of the p-type implanted regions 113A destroyed by ion implantation is recrystallized in the heating process. According to this embodiment, magnesium (Mg) included in the anneal gas is present in the vicinity of the surface of the p-type implanted regions 113A in this heating process, so that magnesium (Mg) is expected to be taken in the gallium nitride (GaN) crystal in the course of recrystallization. In this heating process, magnesium (Mg) taken in the crystal is expected to be activated. This may be the reason why the concentration of magnesium (Mg) is especially higher in the surface layer on the +Z-axis direction side of the n-type semiconductor layer 112, compared with the concentration of magnesium (Mg) in the configuration without the heating process.

B. Second Embodiment

Figure 13:
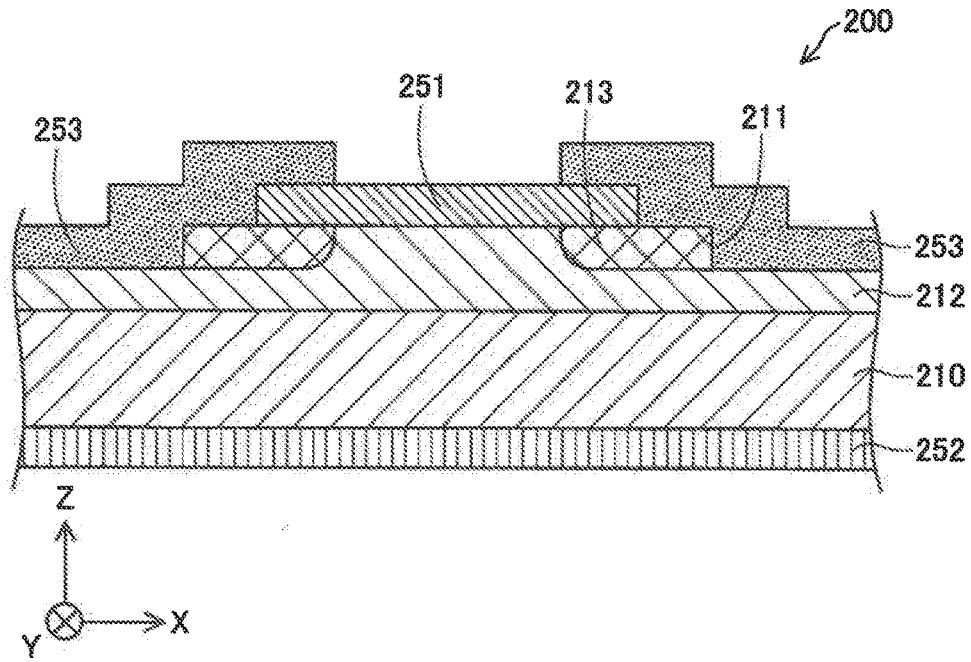
FIG. 13 is a sectional view schematically illustrating the structure of a semiconductor device according to a second embodiment.

FIG. 13 is a sectional view schematically illustrating the structure of a semiconductor device 200 according to a second embodiment. XYZ axes orthogonal to one another are illustrated in FIG. 13, like FIG. 1.

The semiconductor device 200 is a group III nitride-based semiconductor device formed by using a group III nitride semiconductor. According to this embodiment, the semiconductor device 200 is a GaN-based semiconductor device formed by using gallium nitride (GaN). According to this embodiment, the semiconductor device 200 is a vertical Schottky barrier diode. According to this embodiment, the semiconductor device 200 is used for power control and is also called power device.

The semiconductor device 200 includes a substrate 210, an n-type semiconductor layer 212, p-type semiconductor regions 213, a Schottky electrode 251, a rear face electrode 252 and an insulation film 253. The semiconductor device 200 has a mesa 211.

The substrate 210, the n-type semiconductor layer 212 and the p-type semiconductor regions 213 of the semiconductor device 200 respectively correspond to the substrate 110, the n-type semiconductor layer 112 and the p-type semiconductor regions 113 of the first embodiment. More specifically, the substrate 210 of the semiconductor device 200 is similar to the substrate 110 of the first embodiment. The n-type semiconductor layer 212 of the semiconductor device 200 is similar to the n-type semiconductor layer 112 of the first embodiment. The p-type semiconductor regions 213 of the semiconductor device 200 are similar to the p-type semiconductor regions 113 of the first embodiment.

The p-type semiconductor regions 213 of the semiconductor device 200 form respective ends of the mesa 211. The p-type semiconductor regions 213 are arranged adjacent to the n-type semiconductor layer 212. A +Z-axis direction side face of the n-type semiconductor layer 212 and +Z-axis direction side faces of the p-type semiconductor regions 213 form an upper face of the mesa 211.

The Schottky electrode 251 of the semiconductor device 200 is an anode electrode that is formed from an electrically conductive material and is arranged to be in Schottky contact with part of the upper face of the mesa 211. According to this embodiment, the Schottky electrode 251 is mainly made of nickel (Ni).

The insulation film 253 of the semiconductor device 200 is a film that has electrical insulation property and is formed from the periphery of the mesa 211 over to part of the upper face of the Schottky electrode 251. According to this embodiment, the insulation film 253 is a film mainly made of silicon dioxide (SiO$_2$).

The rear face electrode 252 of the semiconductor device 200 is a cathode electrode that is formed from an electrically conductive material and is arranged to be in ohmic contact with a −Z-axis direction-side rear face of the substrate 210. According to this embodiment, the rear face electrode 252 is an electrode formed by stacking a layer mainly made of aluminum (Al) on a layer mainly made of titanium (Ti) and processing the stacked layers by heat treatment. Application of a positive voltage to the Schottky electrode 251 lowers a Schottky barrier formed in an interface between the Schottky electrode 251 and the n-type semiconductor region 212 and thereby forms a conductive path between the Schottky electrode 251 and the rear face electrode 252.

Figure 14:
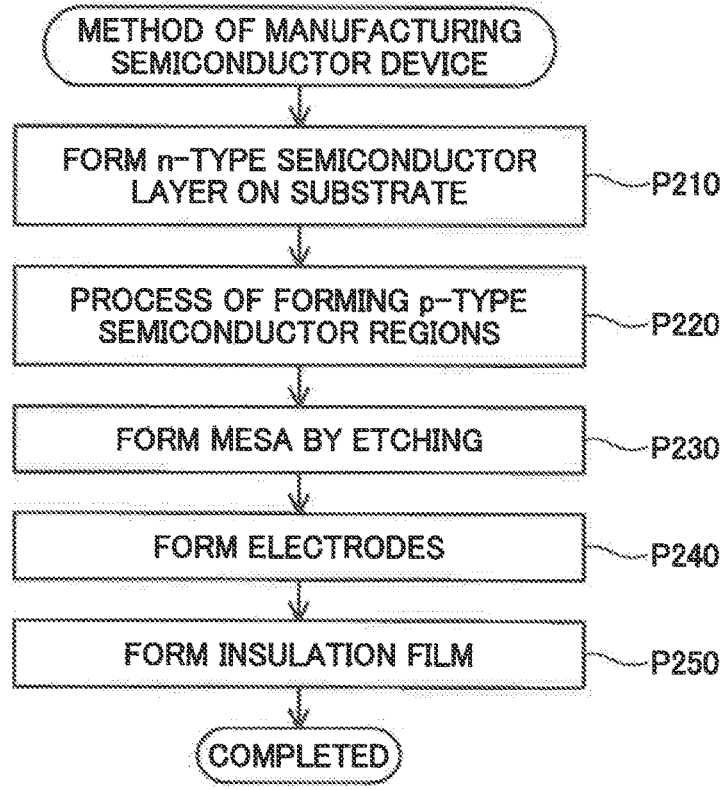
FIG. 14 is a process chart showing a method of manufacturing the semiconductor device according to the second embodiment.

FIG. 14 is a process chart showing a method of manufacturing the semiconductor device 200 according to the second embodiment. The manufacturer first forms the n-type semiconductor layer 212 on the substrate 210 by crystal growth (process P210) in the same manner as the first embodiment. The manufacturer subsequently forms the p-type semiconductor regions 213 in the n-type semiconductor layer 212 (process P220) in the same manner as the process of forming the p-type semiconductor regions 113 (process P120) according to the first embodiment.

Figure 15:
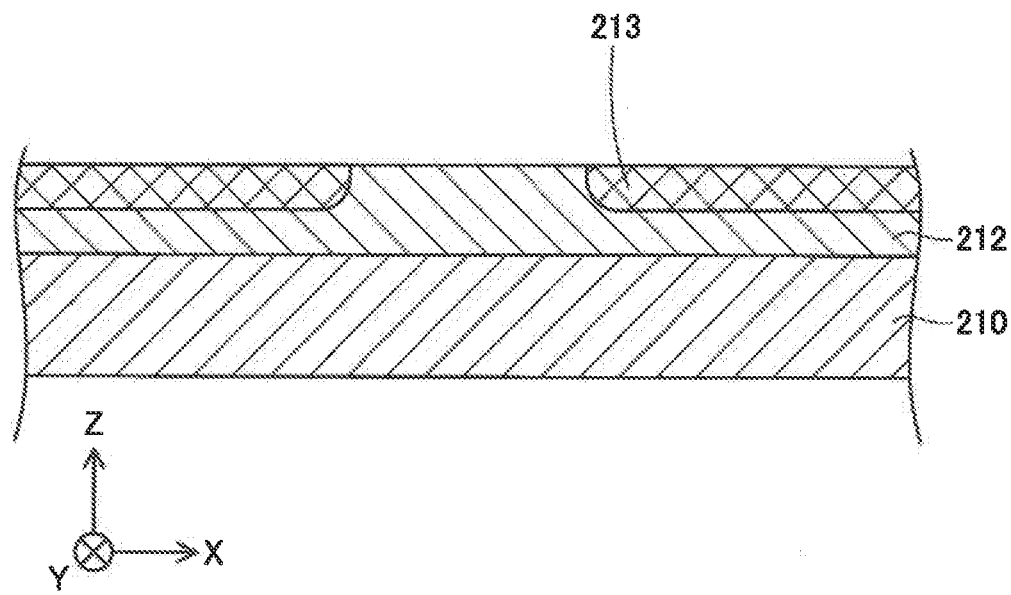
FIG. 15 is a sectional view schematically illustrating the state after formation of p-type semiconductor regions.

FIG. 15 is a sectional view schematically illustrating the state after formation of the p-type semiconductor regions 213. After forming the p-type semiconductor regions 213 (process P220), the manufacturer forms the mesa 211 by etching (process P230).

Figure 16:
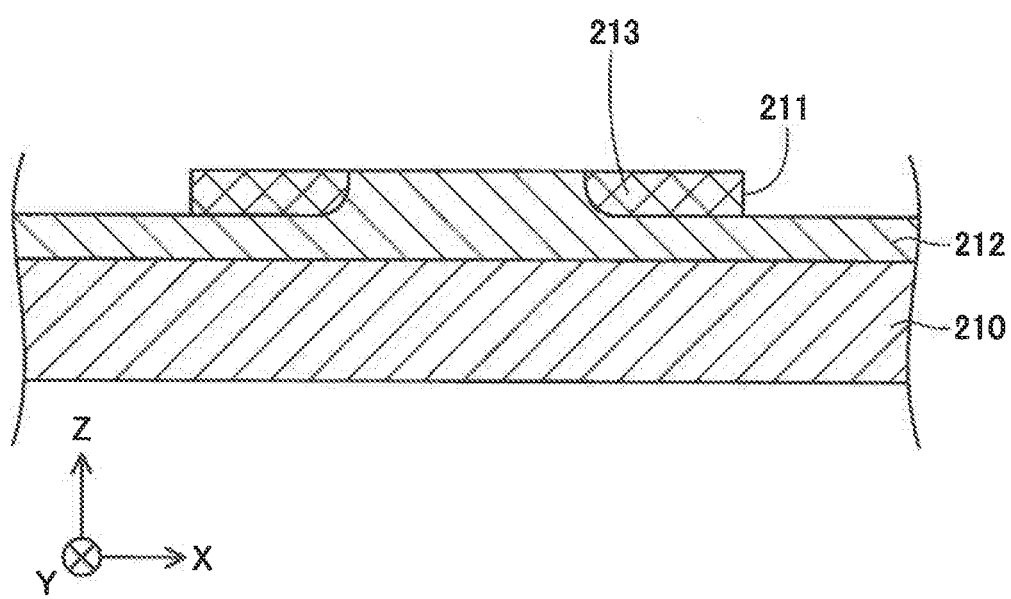
FIG. 16 is a sectional view schematically illustrating the state after formation of a mesa.

FIG. 16 is a sectional view schematically illustrating the state after formation of the mesa 211. According to this embodiment, the manufacturer forms the mesa 211 by dry etching. After forming the mesa 211 (process P230), the manufacturer forms the Schottky electrode 251 and the rear face electrode 252 (process P240).

Figure 17:
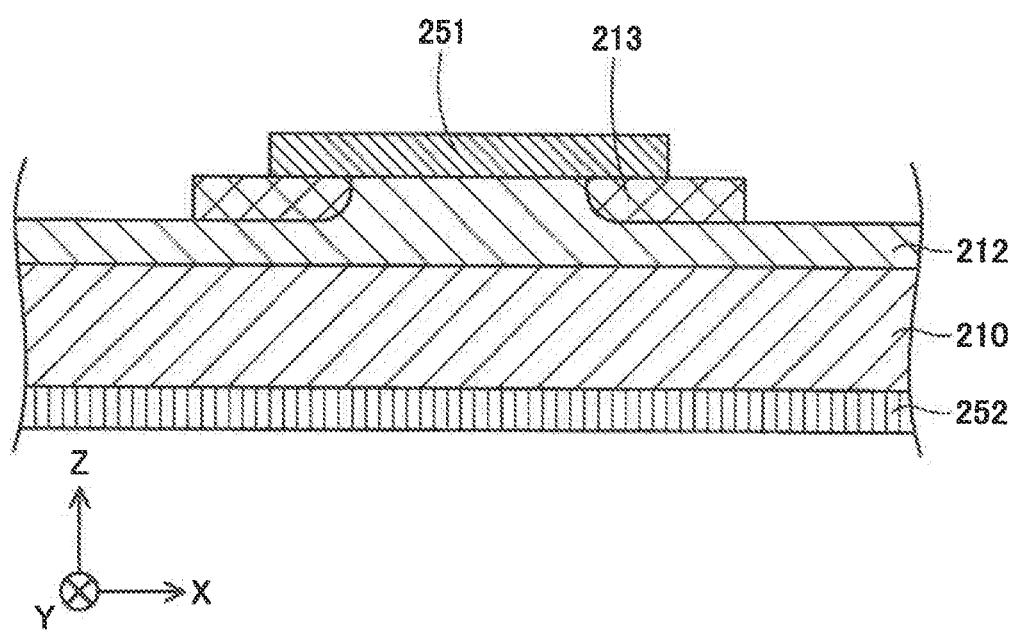
FIG. 17 is a sectional view schematically illustrating the state after formation of a Schottky electrode and a rear face electrode.

FIG. 17 is a sectional view schematically illustrating the state after formation of the Schottky electrode 251 and the rear face electrode 252. The sputtering method is employed for formation of the electrodes according to this embodiment, but the vapor deposition method may be employed.

After that, the manufacturer forms the insulation film 253 (process P250). According to this embodiment, the manufacturer forms the insulation film 253 by atomic layer deposition (ALD). The sputtering method may be employed, instead of atomic layer deposition. The semiconductor device 200 is completed by the series of processes described above.

The manufacturing method of the second embodiment described above uses the process of forming the p-type semiconductor regions 113 of the first embodiment to form the p-type semiconductor regions 213 of this embodiment, so as to manufacture the vertical Schottky barrier diode. The manufacturing method of the second embodiment also decreases the frequency of ion implantation and thereby reduces the manufacturing cost, like the manufacturing method of the first embodiment.

C. Other Embodiments

The disclosure is not limited to any of the embodiments, the examples and the modifications described above but may be implemented by a diversity of other configurations without departing from the scope of the disclosure. For example, the technical features of any of the embodiments, the examples and the modifications corresponding to the technical features of each of the aspects described in SUMMARY may be replaced or combined appropriately, in order to solve part or all of the problems described above or in order to achieve part or all of the advantageous effects described above. Any of the technical features may be omitted appropriately unless the technical feature is described as essential herein.

In the process of forming the p-type semiconductor regions 113 of the first embodiment (process P120 shown in FIG. 3), magnesium (Mg) is included as an element implanted in the ion implantation process (process P123) and is also included in the anneal gas used in the heating process (process P124). The present disclosure is, however, not limited to this configuration. For example, beryllium (Be) may be included as an element implanted in the ion implantation process (process P123) and may also be included in the anneal gas used in the heating process (process P124). In another example, both magnesium (Mg) and beryllium (Be) may be included as elements implanted in the ion implantation process (process P123) and may also be included in the anneal gas used in the heating process (process P124). In another example, magnesium (Mg) may be included as an element implanted in the ion implantation process (process P123), while beryllium (Be) may be included in the anneal gas used in the heating process (process P124). In another example, beryllium (Be) may be included as an element implanted in the ion implantation process (process P123), while magnesium (Mg) may be included in the anneal gas used in the heating process (process P124).

The semiconductor device to which the present disclosure is applied is not limited to the vertical trench MOSFET or the vertical Schottky barrier diode described in the above embodiments but may be, for example, an insulated gate bipolar transistor (IGBT) or an MESFET (metal-semiconductor field effect transistor). The manufacturing method of the present disclosure may be applied to any manufacturing method that includes a process of forming a p-type semiconductor region in an n-type semiconductor layer.

In the above embodiments, the material of the insulation film may be any material having electrical insulation properties. The material of the insulation film other than silicon dioxide ($SiO_2$) may be, for example, at least one of silicon nitrides (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON). The insulation film may be a single layer structure or may be a two layer or more layer structure.

In the embodiments described above, the materials used for the respective electrodes are not limited to the materials described in the above embodiments but may be other materials.

The invention claimed is:

1. A method of manufacturing a semiconductor device, comprising:
    an ion implantation process of implanting at least one of magnesium and beryllium by ion implantation into a first semiconductor layer that is mainly formed from a group III nitride; and
    a heating process of heating the first semiconductor layer in an atmosphere that includes an anneal gas of at least one of magnesium and beryllium, after the ion implantation process.

2. The method of manufacturing the semiconductor device according to claim 1,
    wherein when magnesium is included as an element implanted in the ion implantation process, magnesium is included in the anneal gas, and
    when beryllium is included as an element implanted in the ion implantation process, beryllium is included in the anneal gas.

3. The method of manufacturing the semiconductor device according to claim 1,
    wherein when magnesium is included in the anneal gas, the anneal gas further includes hydrogen and ammonia.

4. The method of manufacturing the semiconductor device according to claim 1,
    wherein an implantation temperature in the ion implantation process is not lower than 20° C. and not higher than 500° C.

5. The method of manufacturing the semiconductor device according to claim 1, further comprising:
    a process of forming a protection film on a surface of the first semiconductor layer, prior to the ion implantation process; and
    a process of removing the protection film, after the heating process.

6. The method of manufacturing the semiconductor device according to claim 5,
    wherein the protection film includes at least one amorphous material selected from the group consisting of aluminum nitride, gallium nitride, indium nitride, aluminum gallium nitride, gallium indium nitride, aluminum indium nitride and aluminum gallium indium nitride.

7. The method of manufacturing the semiconductor device according to claim 1,
    wherein a heating temperature in the heating process is not lower than 800° C. and not higher than 1200° C.

8. The method of manufacturing the semiconductor device according to claim 1,
    wherein a pressure in the heating process is not less than 10 kPa and not greater than 100 kPa.

9. The method of manufacturing the semiconductor device according to claim 1,
    wherein a heating time in the heating process is not shorter than 1 minute and not longer than 60 minutes.

10. The method of manufacturing the semiconductor device according to claim 1, further comprising:
  a process of forming a second semiconductor layer mainly from a group III nitride on a surface of the first semiconductor layer, after the heating process.

* * * * *